United States Patent

Trenary

[11] 4,032,707
[45] June 28, 1977

[54] HOUSING FOR BATTERY-OPERATED DEVICE

[75] Inventor: John M. Trenary, Fort Collins, Colo.

[73] Assignee: Teledyne Industries, Inc., Fort Collins, Colo.

[22] Filed: Feb. 9, 1976

[21] Appl. No.: 656,313

[52] U.S. Cl. .................. 174/52 R; 340/237 S; 429/98

[51] Int. Cl.² ................................. H05K 5/00

[58] Field of Search ............... 174/52 R, 50; 340/237 S, 283; 429/96, 97, 98, 99, 100; 325/361, 119; 35/19 A; 240/10.65; 30/DIG. 1

[56] References Cited

UNITED STATES PATENTS

| | | | |
|---|---|---|---|
| 2,058,755 | 10/1936 | Arnesen | 429/97 |
| 3,071,639 | 1/1963 | Mendelson et al. | 325/361 X |
| 3,137,815 | 6/1964 | Hershey | 35/19 A X |
| 3,175,207 | 3/1965 | Hewitt | 340/283 X |
| 3,340,349 | 9/1967 | Zerwes | 174/53 |
| 3,696,380 | 10/1972 | Murphy | 340/283 |
| 3,887,394 | 6/1975 | Kaye | 429/99 |

Primary Examiner—J. V. Truhe
Assistant Examiner—D. A. Tone
Attorney, Agent, or Firm—Hugh H. Drake

[57] ABSTRACT

A housing contains electrical components that constitute a battery-operated smoke detector and alarm. Forming a part of the housing is a transverse wall that includes at least one opening. Adjacent to that one opening in one surface of the wall are a first succession of semi-cylindrical cavities each diametrically sized to seat a cylindrical battery. A support web is suspended from the wall in a position spaced from and opposite the opening with the wall-facing surface of that web including a second succession of semi-cylindrical cavities each diametrically sized to seat the battery and aligned with the respective cavity formed on the wall so as to captivate a battery therebetween. A cover member is matable with the wall so as to overlie the compartment in which the batteries reside. A lug depends from the cover for locking reception with an aperture formed in the transverse wall. An ear depends from the cover in a position to press against the battery when the cover is installed. Desirably, there are a space-opposed pair of such apertures, lugs and ears, together with a slot positioned in the wall in relationship to the battery opening so as to receive either of the ears when the lugs are engaged in the apertures. The wall also has an inwardly struck wall portion and inwardly projecting posts that serve to mount an electrical-component-mounting substrate.

14 Claims, 13 Drawing Figures

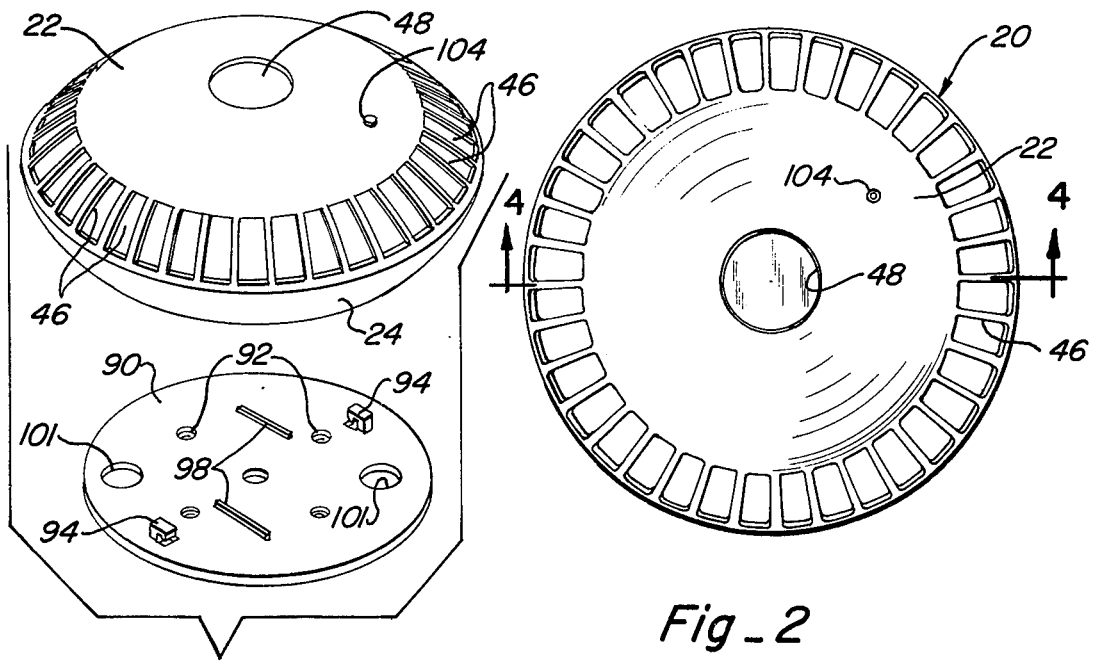
Fig_1
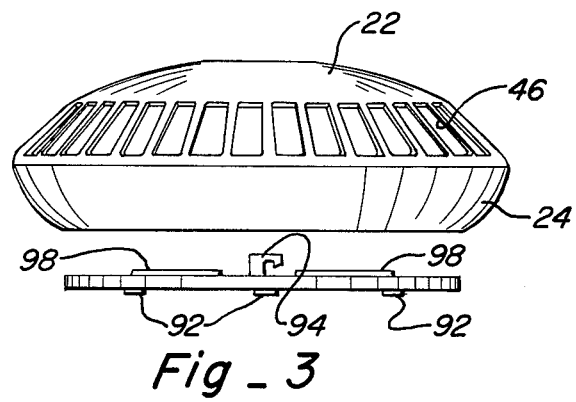
Fig_2
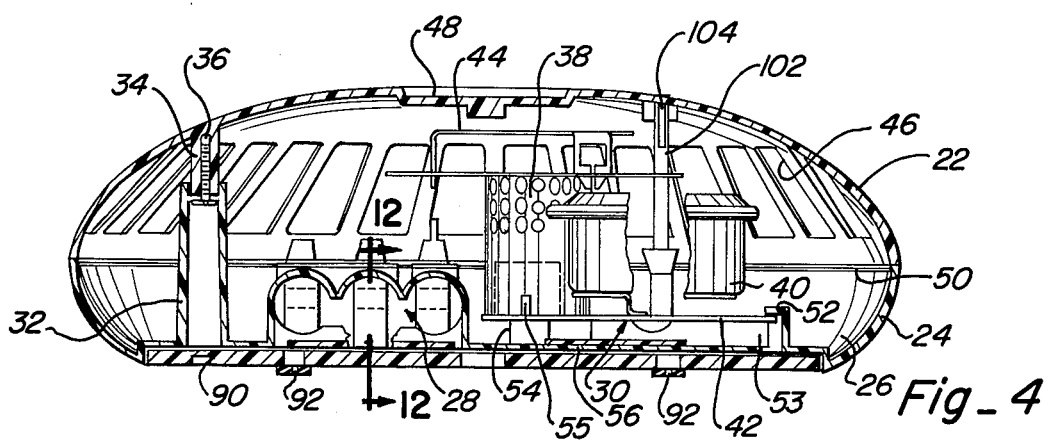
Fig_3
Fig_4

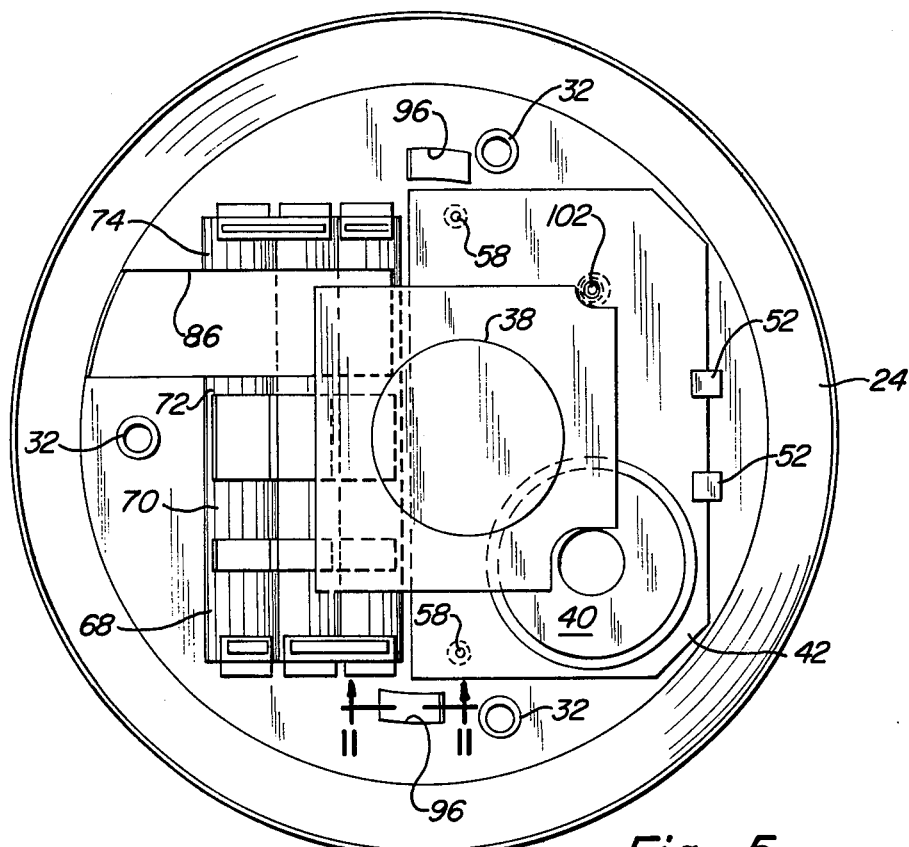
Fig_5
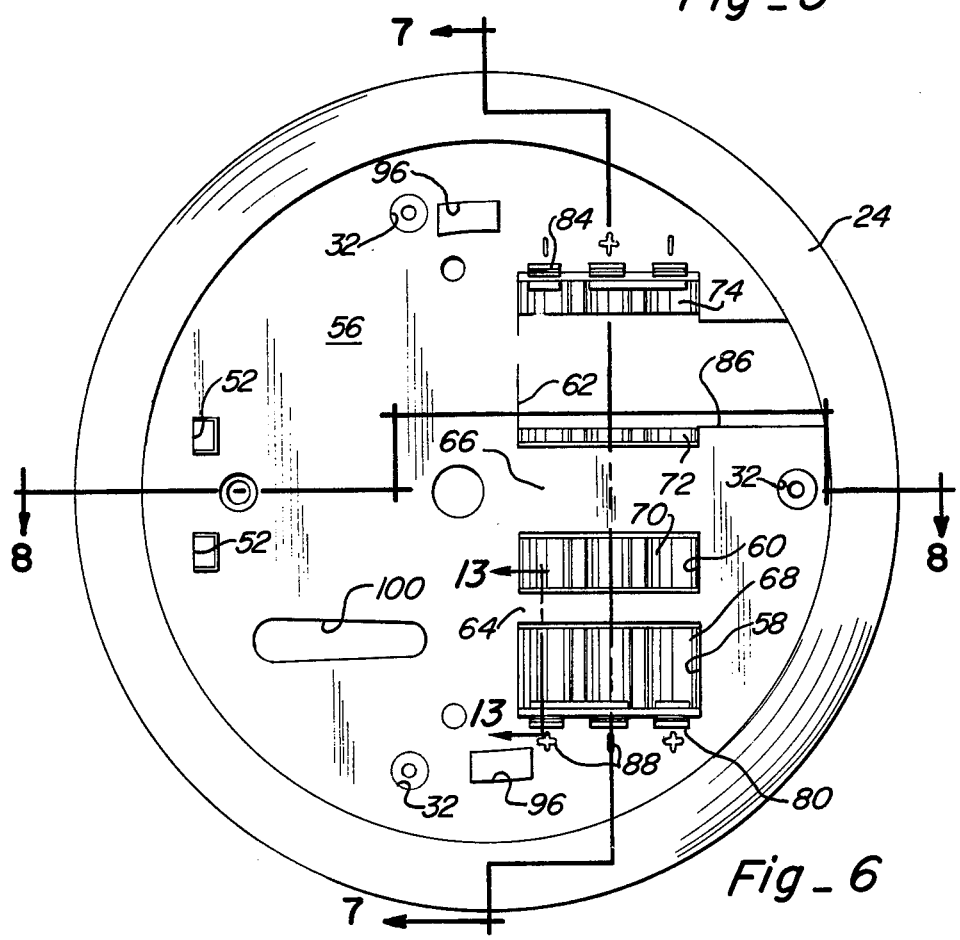
Fig_6

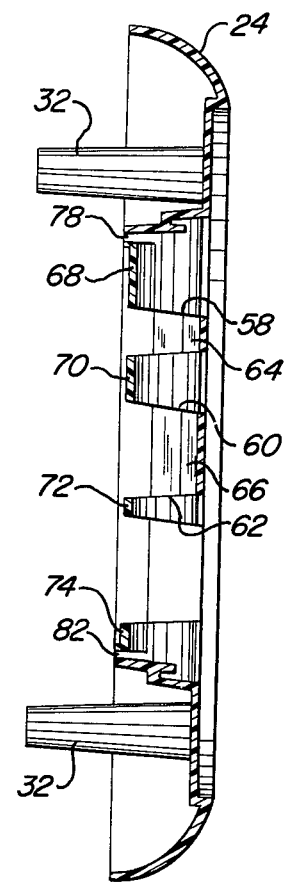
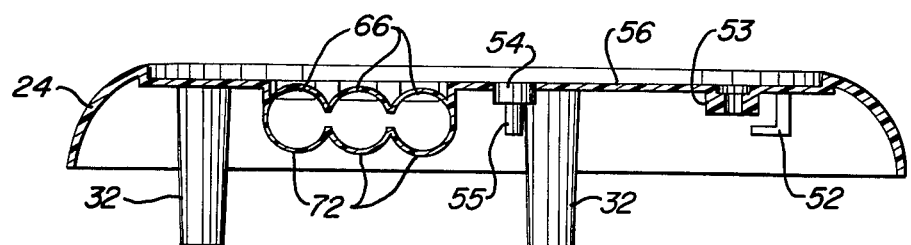
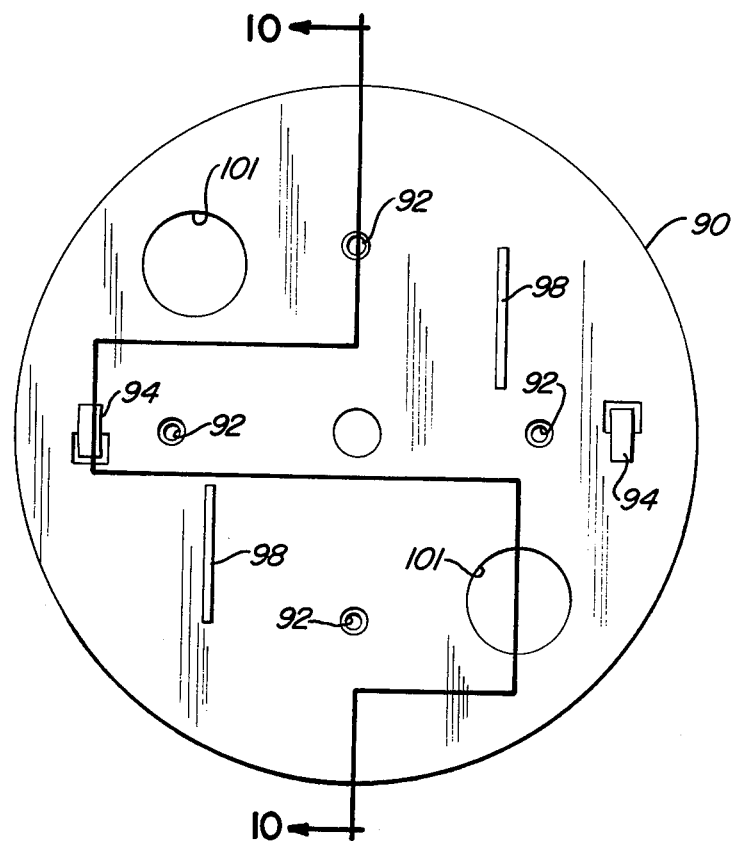

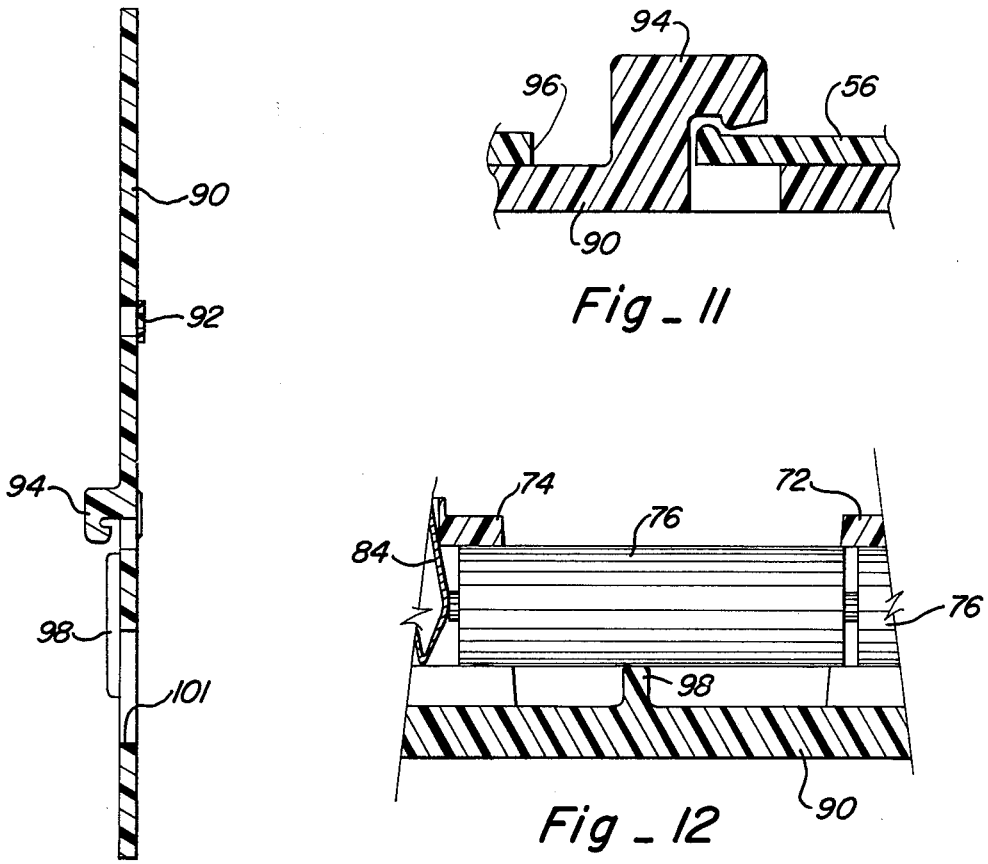
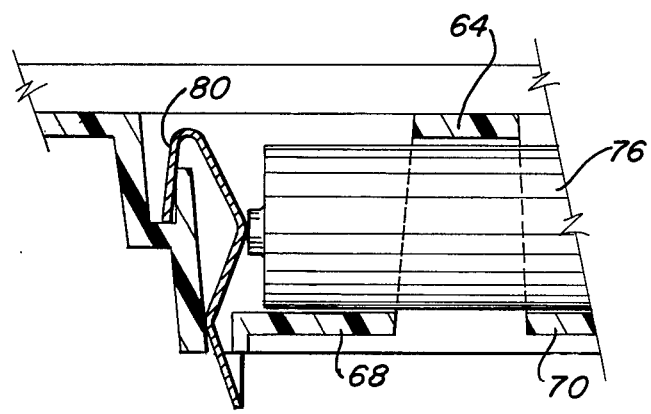

HOUSING FOR BATTERY-OPERATED DEVICE

The present invention pertains to a housing. More particularly, it relates to a housing that contains electrical components of a battery-operated device.

While battery-operated devices have existed for years, the advance of solid-state electronics has resulted in the introduction into the marketplace of a wide variety of products which may be powered by self-contained batteries. Such products, therefore, at least usually include some kind of compartment in which the batteries are received together with suitable electrical contacts for engaging the battery terminals. At least in many cases, the cost of fabrication and assembly of the battery compartment becomes significant. Typically, such battery compartments are at least a source of frustration to the user because of difficulties in loading and unloading the batteries.

In accordance with present-day techniques, the electronic components in any such device usually are mounted upon a substrate that carries printed wiring for interconnecting those different components. Of course, that substrate must somehow be mounted within the housing. At least usually, additional parts must be provided for the purpose of accomplishing such mounting in a secure manner.

Certain of the aforementioned products are of a type designed to be mounted upon a surface such as a wall or ceiling. One example of such a product is a smoke detector and alarm unit. While provision may be made for simply using screws or other fastening devices for fastening the unit directly to the surface, it is desirable, particularly when the unit is battery operated, to be able readily to engage or disengage the unit from some kind of bracket which is the item that is directly affixed to the surface. To achieve that end, prior units of the general kind under discussion have included still additional components in the basic assembly for the purpose of achieving a removable bracket-type mounting. Of course, such additional components lead to increased cost and complexity.

It is a general object of the present invention to provide a new and improved housing for a battery-operated device, a housing which overcomes or at least tends to minimize deficiencies and problems of the kind mentioned above.

A more specific object of the present invention is to provide a housing for a battery-operated device that includes a new and improved battery compartment.

Another object of the present invention is to provide a new and improved housing for such a device that facilitates its mounting upon a given surface. A further object of the present invention is to provide a new and improved housing for a device of the kind under discussion that features an exceedingly simple arrangement for mounting included electronic components.

The invention thus relates to a housing for containing electrical components of a battery-operated device. Forming a part of the housing is a transverse wall that has at least one opening therein. Defined in one surface of that wall adjacent to the opening is a first succession of cavities each sized to seat a battery. A support web is suspended from the wall in a position spaced from and opposite the opening. The surface of that web facing the wall includes a second succession of similar cavities each also sized to seat a battery and aligned with a respective cavity in the first succession so as to captivate a battery therebetween. The inventive features include a cover member that is matable with the transverse wall so as to overlie the battery compartment. At least one aperture is defined in the wall and a lug means depends from the cover member for locking reception within the aperture. At least one ear depends from the wall in a position to press against a battery located in the compartment when the lug is engaged within the aperture. As another feature, a lug is inwardly struck from the wall, and a post projects inwardly from the wall in a position spaced from that lug. An electrical-component- mounting substrate is confined along one edge by the lug and is staked along another edge by the post.

The features of the present invention which are believed to be novel are set forth with particularity in the appended claims. The organization and manner of operation of the invention, together with further objects and advantages thereof, may best be understood by reference to the following description taken in connection with the accompanying drawings, in the several figures of which like reference numerals identify like elements, and in which:

FIG. 1 is an exploded and reduced isometric view of a housing and associated mounting bracket for a battery-operated device;

FIG. 2 is a top plan view of the housing;

FIG. 3 is a side-elevational view of the housing;

FIG. 4 is an enlarged cross-sectional view of the housing and bracket, taken along the line 4—4 in FIG. 2, and exemplifying the mounting of certain component within the housing;

FIG. 5 is a top plan view of the housing of FIG. 4 with its upper shell removed;

FIG. 6 is a bottom plan view of the lower shell of the housing of FIG. 4 with the bracket removed;

FIG. 7 is a cross-sectional view taken along the line 7—7 in FIG. 6 and then inverted FIG. 8 is a cross-sectional view taken along the line 8—8 in FIG. 6 and then inverted;

FIG. 9 is a top plan view of the bracket shown in FIG. 1;

FIG. 10 is a cross-sectional view taken along the line 10—10 in FIG. 9;

FIG. 11 is an enlarged fragmentary cross-sectional view taken along the line 11—11 in FIG. 5;

FIG. 12 is an enlarged fragmentary cross-sectional view taken along the line 12—12 in FIG. 4; and with batteries therein installed; and FIG. 13 is an enlarged fragmentary cross-sectional view taken along the line 13—13 in FIG. 6.

While the various features of the present invention are susceptible of use in connection with a wide variety of products, they are embodied herein as part of a smoke detector and alarm. Such units typically are mounted upon a ceiling or wall of a building and sound an alarm when smoke is detected. Often, they desirably are battery operated so as to be independent of the normal electrical system in the building, because that electrical system might become inoperative in the case of a fire and might even be the cause of the fire. In addition, battery operation avoids the necessity of having to run wires within the building. Illustratively, the kind of smoke detector and alarm utilized with the apparatus to be further described herein is of the ionization type. An ionization chamber, activated by a radioactive source, detects the presence of combustion products and thereupon develops an electrical signal to cause an alarm to sound. As an example, the particular unit employed is of the kind described and claimed in U.S. Pat. No. 3,778,800 issued Dec. 11, 1973, and assigned on its face to Statitrol, Corporation. That system is one in which the same alarm generator serves both to signal the presence of smoke or related combustion products and to signal, in a distinctive manner, the nearness of an end to the life of the battery power source. Only one battery power source, which in itself is composed of several individual battery cells, is required for energizing both functions. Because the electrical system of that patent constitutes the presently preferred embodiment to be used in connection with the housing of the present invention, that patent is incorporated herein by reference. However, a detailed description of the operation of the electric system involved need not be and is not included in this specification, and it is to be understood that other electronic sensing and alarm-producing systems may be substituted.

Turning, then, to the particulars of the embodiment of the present inventive structure, a housing 20 includes a pair of mating shells 22 and 24 which, when joined together, define a chamber 26 that serves as a housing to contain a battery compartment 28 and an electronic system 30 as above described. Shell 24 includes integrally-formed hollow posts 32 which project inwardly toward mating bosses 34 that, in turn, project inwardly from shell 22. A screw 36 received within each post 32 serves to clamp each post to its respective one of bosses 34.

System 30 includes an ionization chamber 38 and an audio sounding device or loudspeaker 40, both mounted from a substrate 42 which also carries the various solid-state components necessary to complete the electronic system for detection and alarm. A baffle assembly 44 cooperates with ionization chamber 38 for the purpose of permitting sensing while avoiding erroneous indications arising from normal air currents. To permit ingress of smoke and related combustion products, as well as to permit transmission to the surrounding area of audible signals from loudspeaker 40, shell 22 includes a circumferential succession of louvers 46.

An inset 48 is formed in the central external region of shell 22 for the purpose of receiving an indicia plate. Extending transversely across the unit at approximately the plane defined by the place of closure between shells 22 and 24 is an insulating layer 50. Layer 50 serves to shield many of the various components from view as seen by looking through louvers 46.

Substrate 42 is held in place within the device by means of a pair of lugs 52 and a pair of posts 54. Lugs 52 are struck inwardly from a generally planar wall 56 of shell 24 and are so located as to engage and captivate one edge margin of substrate 42. An inwardly projecting stub 53, located midway between lugs 52, serves to anchor substrate 42 against the engaging faces of lugs 52. Each of posts 54 includes a necked-down portion 55 which is received within a corresponding hole formed in substrate 42 and which, after assembly, is peened over so as to confine the substrate in place.

Battery compartment 28 is formed directly, during the molding process, as a part of wall 56. More specifically, compartment 28 includes three different openings 58, 60 and 62 (FIG. 6). On the inward side of wall 56 between openings 58 and 60 is a succession of three semi-cyclindrical cavities 64. Between openings 60 and 62 is a similar succession of such cavities 66 axially aligned with cavities 64. Spaced from the opposite opening 58 is a support web 68. Similarly opposite opening 60 is a support web 70. Likewise spaced from and opposite respective end portions of opening 62 are support webs 72 and 74. Each of these support webs is formed to have its surface facing wall 56 shaped to define a succession of semi-cylindrical cavities that are aligned with respective cavities 64 and 66. All of such cavities are diametrically sized so as to seat and, all together, to captivate cylindrical batteries 76 therebetween (FIG. 12).

Formed at the outer end of each web 68 and as an integral part of wall 56 is a recess 78 that receives a resilient spring contact 80. Similarly formed at the opposite and outer end of each web 74 is a corresponding recess 82 in which is received a like resilient electrical contact 84. Contacts 80 and 84 are so interconnected and coupled to electronic system 30 as to supply power from the installed batteries to that system.

In use, three cylindrical batteries are first inserted through opening 62 into the channels defined by respective cavities 64, 66, 68 and 70. Thereafter, three more batteries are inserted through opening 62 so as to be captivated by cavities 66, 72 and 74. The length of the thus-formed battery compartment, as measured between terminals 80 and 84, is such that each axially-aligned pair of batteries are held in series contact between the respective terminals at the opposite ends of such pair. Adjacent to opening 62 in wall 56 is a cutout 86 which facilitates removal of the batteries by insertion of the finger of the user.

As has been specifically illustrated, the different cavities of battery compartment 28 serve to confine a total of six type AA batteries. It will be observed that the arrangement is such that, using standard plastic molding procedure and plastic material for the housing structure, openings 58, 60 and 62 are so arranged with respect webs 68, 70, 72 and 74, as well as cavities 64 and 66, that the entire battery compartment is formed together with the remainder of transverse wall 56 with but a single stroke of closure of opposing mold faces in a conventional injection molding process.

Of course, opening 62 permits the ingress and egress of all of the batteries. Openings 58 and 60 are present, in the first instance, by reason of the manner of formation of the respective underlying webs. At the same time, opening 58 serves to permit the user to check that the battery polarities are correct. To that end, battery polarity markings preferably are embossed right into transverse wall 56 as indicated, for example, at 88.

As so far described, the smoke alarm device is fully functional. If desired, it might be simply placed at rest upon a shelf or other suitable surface. Preferably, however, it is attached to a bracket 90 that is affixed to a ceiling or wall surface by means of screws or other mounting devices that extend through counterbored openings 92 circularly distributed around the area of bracket 90. Depending outwardly from the outer surface of bracket 90 are diametrically spaced locking lugs 94 so disposed as to be received within corresponding apertures 96 formed in transverse wall 56. A pair of elongated ears 98 project outwardly from bracket 90 in the same direction as locking lugs 94. The arrangement of lugs 94 and ears 98 is such that, when lugs 94 are lockingly engaged in apertures 96, one or the other of ears 98 is disposed over openings 62 in position to clamp the batteries beneath that opening securely in place. With bracket 90 in that position relative to housing 20, the other ear 98 is received within an elongated recess 100 formed in transverse wall 56. By reason of this arrangement, housing 20 may be mounted upon bracket 90 in either of two orientations separated by 180° of circular movement. Once bracket 90 has been affixed to a supporting surface, the housing unit is very simply installed by inserting lugs 94 within apertures 96 and exerting a slight clockwise rotation upon the housing. Removal, as for battery replacement, is readily accomplished by means of a reverse counterclockwise movement of only a slight amount. To facilitate handling during its mounting, bracket 90 includes a pair of diametrically-spaced finger openings 101.

An optical light pipe 102 extends away from a light-emitting diode carried upon substrate 42 and forming a part of electronic system 30. The outer end of light pipe 102 terminates just beyond a receiving aperture 104 formed in shell 22. Electronic system 30 is such as to cause a flash of light to be emitted from light pipe 102 approximately every six seconds so long as the condition of the battery monitoring circuitry is normal and the system otherwise is operative.

It will be observed that the entire housing and mounting bracket assemblies are capable of being manufactured from simple and direct single-stroke molding operations. Subsequent mounting of the electronic detection and alarm system requires minimal procedure. Detachable mounting of the primary unit is entirely facilitated by the same simple molding procedure. The battery compartment likewise is formed in its entirety, except for the addition of the contact terminals, as a result of the very same simple molding procedure. Yet, the batteries themselves are readily removed and installed.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. In a housing for containing electrical components of a battery-operated device, the improvement comprising:
   a transverse wall forming a part of said housing;
   means defining at least one opening in said wall;
   means defining in one surface of said wall adjacent to said
   and a support web suspended from said wall in a position spaced from and opposite said opening, the surface of said web facing said wall including means defining a second succession of cavities each sized to seat a battery and aligned with a respective cavity in said first succession so as to captivate such a battery therebetween.

2. A housing as defined in claim 1 in which said support web is integral with said wall.

3. A housing as defined in claim 2 in which said wall is of a plastic material and in which said web is so located as to be formed, along with said first and second successions of cavities, upon a single stroke of opposing mold faces.

4. A housing as defined in claim 1 in which said wall further includes means defined therein for accepting and locating electrical contact elements in alignment with respective ones of said cavities to coordinate with respective batteries.

5. A housing as defined in claim 1 which further includes:
   a second opening in said wall spaced from the first in the direction axially of said cavities;
   a second support web suspended from said wall in a position spaced from and opposite said second opening, the surface of said web facing said wall similarly defining another succession of corresponding ones of such cavities;
   and additional means in said one surface adjacent to said second opening defining mating ones of such corresponding cavities.

6. A housing as defined in claim 1 which further includes a second opening in said wall spaced from the first in the direction axially of said cavities, the dimension of said second opening in such axial direction being sufficient to permit insertion of the batteries through said second opening into a position captivated by said first and second successions of cavities.

7. A housing as defined in claim 6 which still further includes another support web suspended from said wall spaced from and opposite said second opening, the surface of said web facing said wall similarly defining another succession of corresponding ones of such cavities.

8. A housing as defined in claim 7 in which said openings and support webs are dimensioned to accept a second set of batteries in physically series relationship to a first set disposed beneath the first opening.

9. A housing as defined in claim 1 in which said wall includes means defining a cut-out disposed laterally of said opening to permit access for dislodgment of batteries captivated within said cavities.

10. A housing as defined in claim 1 which further includes:
    a cover member matable with said wall to enclose the side of said opening remote from said web;
    means defining at least one aperture in said wall;
    lug means depending from said cover member for locking reception within said aperture;
    and an ear depending from said cover member in a position to press upon said batteries through said opening when said lug is received within said aperture.

11. A housing as defined in claim 10 which includes:
    a space-opposed pair of said apertures;
    a corresponding space-opposed pair of said lug means;
    a likewise corresponding space-opposed pair of such ears;
    and means defining a slot in said wall positioned in relationship to said opening to receive either of said ears when said lug means are engaged with said apertures.

12. A housing as defined in claim 1 which further includes:
    at least one lug inwardly struck from said wall and spaced laterally from said opening;
    at least one post projecting inwardly from said wall and spaced from said lug;
    and an electrical-component-mounting substrate confined along one edge by said lug and staked along another edge by said post.

13. In a housing for containing electrical components of a battery-operated device, the improvement comprising.
    a transverse wall forming a part of said housing;

means defining a battery compartment opening through said wall;
a cover member matable with said wall to overlie said compartment
means defining at least one aperture in said wall;
lug means depending from said cover member for locking reception within said aperture;
and an ear depending from said cover member in a position to press against a battery located in said compartment when said lug is received within said aperture.

14. A housing as defined in claim 13 which includes:
a space-opposed pair of said apertures;
a corresponding space-opposed pair of said lug means;
a likewise corresponding space-opposed pair of such ears;
and means defining a slot in said wall positioned in relationship to said compartment to receive either of said ears when said lug means are engaged with said apertures.

* * * * *